United States Patent
Kasahara et al.

(10) Patent No.: US 6,714,772 B2
(45) Date of Patent: Mar. 30, 2004

(54) WIRELESS COMMUNICATION SYSTEM

(75) Inventors: Masumi Kasahara, Takasaki (JP); Koichi Yahagi, Takasaki (JP)

(73) Assignee: Renesas Technology Corp., Tokyo (JP)

( * ) Notice: Subject to any disclaimer, the term of this patent is extended or adjusted under 35 U.S.C. 154(b) by 575 days.

(21) Appl. No.: 09/788,363

(22) Filed: Feb. 21, 2001

(65) Prior Publication Data

US 2001/0016476 A1 Aug. 23, 2001

(30) Foreign Application Priority Data

Feb. 23, 2000 (JP) ........................................ 2000-046200

(51) Int. Cl.⁷ ................................................ H04B 7/00
(52) U.S. Cl. ...................... 455/260; 455/259; 455/262; 455/264; 327/156; 327/157; 375/374; 375/375
(58) Field of Search ................................ 455/208, 209, 455/255, 552.1, 180.3, 85, 86, 87, 260, 262, 264, 259; 331/10, 14, 17, 25; 327/156, 157; 375/373, 374, 375, 376

(56) References Cited

U.S. PATENT DOCUMENTS

| | | | | |
|---|---|---|---|---|
| 5,170,130 A | * | 12/1992 | Ichihara | ...................... 327/157 |
| 5,276,408 A | * | 1/1994 | Norimatsu | ...................... 331/8 |
| 5,304,951 A | | 4/1994 | Cosand | |
| 5,379,002 A | * | 1/1995 | Jokura | ......................... 331/10 |
| 5,774,023 A | * | 6/1998 | Irwin | .......................... 331/17 |
| 5,847,614 A | * | 12/1998 | Gilbert et al. | ................. 331/14 |
| 5,864,572 A | * | 1/1999 | Bhagwan | ..................... 714/815 |
| 6,140,853 A | * | 10/2000 | Lo | ............................... 327/157 |
| 6,163,186 A | * | 12/2000 | Kurita | ......................... 327/157 |
| 6,466,100 B2 | * | 10/2002 | Mullgrav et al. | ........... 331/179 |
| 6,573,769 B1 | * | 6/2003 | Zhang et al. | ................ 327/156 |

FOREIGN PATENT DOCUMENTS

JP         6-21811         1/1994

* cited by examiner

*Primary Examiner*—Sonny Trinh
(74) *Attorney, Agent, or Firm*—Mattingly, Stanger & Malur, P.C.

(57) ABSTRACT

A wireless communication system, which is provided with a PLL circuit having a plurality of oscillators and is capable of processing two or more transmit and receive signal different in frequency band from one another according to the switching between the oscillators, has a reset means which resets a voltage applied to each of filter capacitors lying within the PLL circuit to a predetermined voltage when the switching between the oscillators is performed.

11 Claims, 7 Drawing Sheets

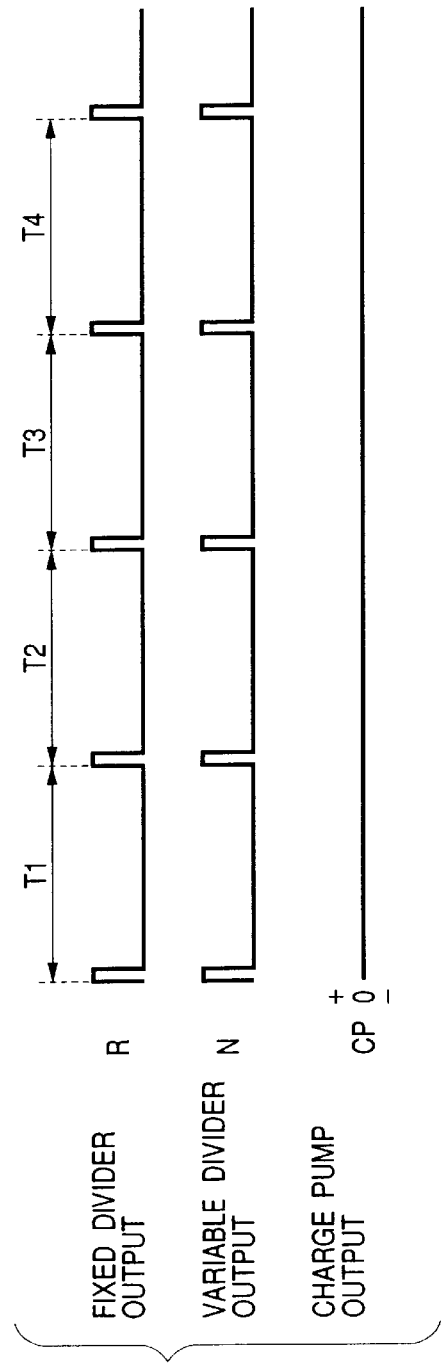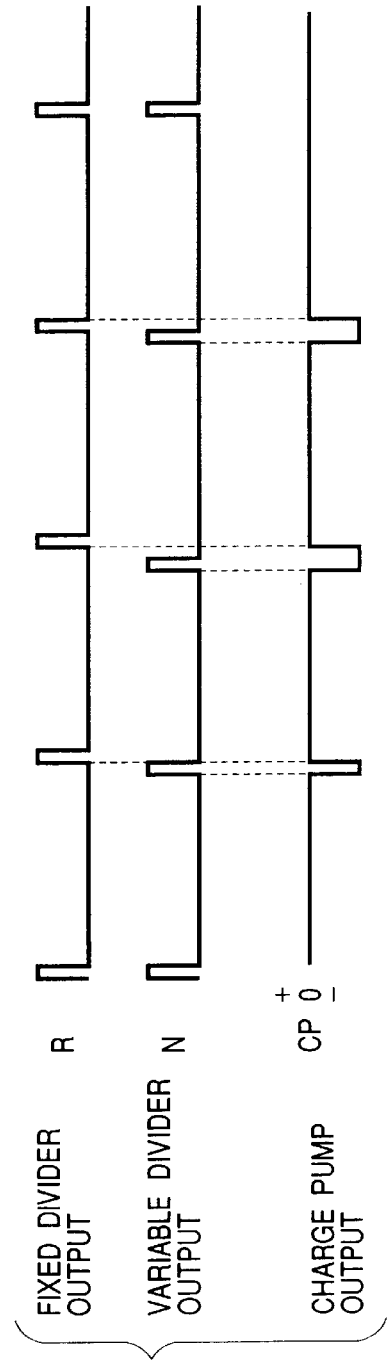

_US 6,714,772 B2_

WIRELESS COMMUNICATION SYSTEM

BACKGROUND OF THE INVENTION

The present invention relates to a technology effective for application to a PLL (Phase-Locked Loop) circuit provided with a plurality of VCO (Voltage-Controlled Oscillators) and capable of performing switching between oscillation frequencies, and a technology effective for application to a PLL circuit used as a local oscillator for generating an oscillation signal having a predetermined frequency, which is merged with a receive signal and a transmit signal in a wireless communication apparatus such as a portable or cellular telephone or the like capable of transmitting and receiving signals lying in plural bands, and to a wireless communication system using the PLL circuit.

As a mobile system like a portable or cellular telephone, may be mentioned, dual-band type cellular telephones capable of handling signals lying in two frequency bands, like, for example, a GSM (Group Special Mobile) using a band which ranges from 880 MHz to 915 MHz and a DCS (Digital Cellular System) using a band which ranges from 1710 MHz to 1785 MHz. In the cellular telephone, a PLL circuit is used as a local oscillator for generating an oscillation signal having a predetermined frequency, which is merged with a receive signal and a transmit signal. However, the cellular telephone capable of handling the signals lying within the two frequency bands much different from each other as described above encounters difficulties in covering the two frequency bands by one VCO from the viewpoint of circuit's characteristics. Thus, VCO corresponding to their frequencies are provided and selected according to a used frequency band.

FIG. 5 shows an example of a configuration of a conventional PLL circuit employed in a dual-band type cellular telephone. The PLL circuit comprises a divider 11A which frequency-divides a reference frequency signal TCXO like 13 MHz into a signal R (hereinafter called a "reference side pulse") of about 200 KHz substantially equal to a channel interval, a divider 11B which frequency-divides a feedback signal F sent from either one of VCO into a pulse N (hereinafter called a "feedback side pulse") having a frequency of 200 KHz identical to the reference side pulse R, a phase comparator 12 which compares the phase of the feedback side pulse N with that of the reference side pulse R and detects the difference in phase therebetween, a charge pump circuit 13 which delivers an electrical charge corresponding to the detected phase difference and draws or discharges it, a loop filter 14 which generates a voltage corresponding to the electrical charge supplied from the charge pump circuit 13, two voltage-controlled oscillators (VCO) 15A and 15B each of which oscillates at a frequency corresponding to the generated voltage, and a selector switch 16 for selecting and feeding back oscillation outputs of these voltage-controlled oscillators 15A and 15B.

Incidentally, the interval between channels (frequency bands) is 200 KHz in the PLL circuit employed in the cellular telephone. In order to generate a local oscillation signal merged with a transmit/receive signal and identical to each selected channel in frequency from the PLL circuit for the purpose of selecting a desired channel from plural channels, a variable divider capable of changing a division ratio is used as the feedback side divider 11B. When the switching between the channels is performed, the division ratio of the variable divider 11B is changed to another according to a control signal sent from a system controller.

When a used band is changed from a GSM band to a DCS band or from the DCS band to the GSM band, the selection of the division ratio of the variable divider 11B according to the control signal sent from the system controller and the switching between the outputs of the voltage-controlled oscillators (VCO) 15A and 15B by the switch 16 are substantially simultaneously carried out. Since, at this time, the time required to obtain the stabilization of a VCO output owing to the output changeover of the switch 16 is longer than a response time of a division output based on the selection of the division ratio of the variable divider 11B, the switching to the VCO is normally carried out on ahead.

SUMMARY OF THE INVENTION

It has however been revealed that the PLL circuit employed in the conventional dual-band type cellular telephone has a problem in that a pull-in time of the PLL circuit becomes long upon band changeover due to the reasons to be described below.

FIG. 6(A) shows the outputs of the dividers 11A and 11B and the output of the charge pump circuit 13 when the PLL circuit has been locked. As shown in the same drawing, the output (reference side pulse R) of the divider 11A and the output (feedback side pulse N) of the variable divider 11B are coincident in phase with each other. The output CP of the charge pump circuit 13 is kept constant at 0 V. When a division ratio n of the variable divider 11B is lowered to decrease the oscillation frequency of the PLL circuit in this state, the cycle of the output (feedback side pulse N) of the variable divider 11B becomes shorter than that of the output (reference side pulse R) of the divider 11A as shown in FIG. 6(B). Therefore, a negative current pulse CP is outputted from the charge pump circuit 13 so as to lower the frequency of each VCO. Since, at this time, the channel interval is 200 KHz within the same band and the division ratio is not greatly varied, the cycle of the feedback F becomes long and hence the PLL circuit is promptly brought to such a locked state as shown in FIG. 6(A).

On the other hand, when the division ratio n of the variable divider 11B is rendered high to increase the oscillation frequency of the PLL circuit, the cycle of the output (feedback side pulse N) of the variable divider 11B becomes longer than that of the output (reference side pulse R) of the divider 11A contrary to the above. Therefore, a positive current pulse CP is outputted from the charge pump circuit 13 so as to increase the frequency of each VCO. Further, the cycle of the feedback signal F becomes short and hence the PLL circuit is promptly brought to the locked state if the channel interval falls within the same band. Thus, the stabilization of the frequency is promptly carried out upon a change in the division ratio n of the variable divider 11B with the selection of the channel within the same band.

Since, however, the changeover in the switch 16 is done upon the changeover of the band from the GSM band to the DCS band, the cycle of the output (feedback side pulse N) of the variable divider 11B becomes abruptly short from a cycle T1 in which a changeover in VCO is done as in the case of a timing t1 shown in FIG. 7. Therefore, a negative current pulse CP long in width is outputted from the charge pump circuit 13 so as to lower the frequency of the corresponding VCO. Further, even if two pulses outputted from the other divider (variable divider B) are introduced during one cycle of the output of one divider (reference side divider 11A herein) as in the case of a cycle T3, the phase comparator 12 does not make a comparison with the two pulses. Therefore, the negative current pulse CP outputted from the charge pump circuit 13 becomes considerably long. As a result, the output of the VCO on the selection side is transferred or transitioned to the lowest frequency of a frequency variable range.

When the division ratio of the variable divider 11B is changed to another with a timing t2 in a cycle T4 upon such a condition, the cycle of the output (feedback side pulse N) of the variable divider 11B becomes long. However, the rising edge of the output (feedback side pulse N) of the variable divider 11B becomes earlier than that of the output (reference side pulse R) of the reference side divider 11A according to the division-ratio switching timing as in the case of a cycle T5. Thus, the negative current pulse CP would be outputted from the charge pump circuit 13 though the positive current pulse CP is expected to be outputted from the charge pump circuit 13. As a result, the PLL circuit is started up from an open state, and phase lock-up, i.e., a frequency pull-in time might be long.

Since the cycle of the output (feedback side pulse N) of the variable divider 11B becomes abruptly long upon the changeover of the band from the DCS band to the GSM band contrary to the above, a positive current pulse CP long in width is outputted from the charge pump circuit 13 so as to increase the frequency of the corresponding VCO. Thus, the output of the VCO on the selection side is transitioned to the highest frequency side in the frequency variable range. When the division ratio of the variable divider 11B is changed to another upon such a condition, the positive current pulse CP is outputted from the charge pump circuit which is originally expected to output the negative current pulse. Thus, the frequency pull-in time of the PLL circuit might be lengthened.

As described above, the conventional PLL circuit has a problem in that whether the initial or first rising edge of the output (feedback side pulse N) of the variable divider 11B becomes earlier or later than the rising edge of the output (reference side pulse R) of the reference side divider 11A after the completion of a division-ratio changeover, is not determined uniquely and depends on each division-ratio switching timing, thus causing a variation in frequency pull-in time. It has been revealed that, in a wireless communication system like a portable or cellular telephone which handles only a voice signal, such a variation in frequency pull-in time at the selection of the VCO and division ratio would not exceed an allowable range. However, when an attempt to add a high-speed communication function to a cellular telephone is made, the amount of the variation in the frequency pull-in time would exceed the allowable range.

An object of the present invention is to reduce a frequency pull-in time at a changeover in VCO in a wireless communication system provided with a PLL circuit having a plurality of VCO.

Another object of the present invention is to allow the completion of frequency pulling-in within a predetermined time upon a changeover in VCO in a wireless communication system provided with a PLL circuit having a plurality of VCO.

The above, other objects and novel features of the invention will become apparent from the description of the present specification and the accompanying drawings.

Summaries of typical ones of the inventions disclosed in the present application will be explained as follows:

A wireless communication system comprising a PLL circuit having a plurality of oscillators and capable of performing switching between the oscillators to thereby process two or more transmit and receive signals different in frequency band from each other is provided with reset means which resets a voltage applied to each of filter capacitors to a predetermined voltage, based on a signal outputted from control means, when the switching is made between the oscillators.

According to the above means, since each of the oscillators oscillates without being affected by a control voltage prior to its changeover upon the switching between the oscillators, a frequency pull-in time of the PLL circuit can be shortened.

The PLL circuit includes a variable divider which frequency-divides a feedback signal sent from any of the oscillators, which is phase-compared with a frequency signal defined as the reference by the phase comparator. A division ratio of the variable divider is changed based on the signal outputted from the control means to thereby select the frequencies of the transmit and receive signals. Thus, a band for a signal transmitted/received according to the switching between the oscillators can be changed to another, and a desired frequency lying in each band can be selected according to the change in the division ratio of the variable divider.

The resetting of each of the filter capacitors by the reset means can be done so as to reach an arbitrary fixed potential but may preferably be reset to a ground potential. This is because it is the stablest voltage and can easily be obtained.

It is desirable that the change in the division ratio of the variable divider is carried out after the switching between the oscillators has been performed, the variable divider is reset to an initial state after the change in the division ratio, and the resetting of each filter capacitor by the reset means is carried out in interlock with the resetting of the variable divider. This is because since the time required to obtain the stabilization of a frequency after the change in the division ratio of the variable divider is shorter than the time required to obtain the stabilization of a post-change frequency after the switching between the oscillators, a total frequency pull-in time can be shortened.

It is desirable that the change in the division ratio of the variable divider is carried out after the switching between the oscillators has been performed, the resettings of the variable divider and each filter capacitor are started simultaneously after the change in the division ratio of the variable divider, and the resetting of each filter capacitor is released after the variable divider has been released from resetting. Thus, it is possible to avoid that a signal defined as the reference and the edge of a feedback signal are phase-compared immediately after the phase comparator has been released from resetting, thereby preventing a malfunction.

There is provided reset signal generating means which generates a control signal for resetting the variable divider. The reset signal generating means may preferably be configured so as to generate a reset signal brought to an effective level during a period between a first pulse of the frequency signal defined as the reference and a pulse subsequent to the first pulse after the change in division ratio, based on a signal for setting the division ratio of the variable divider and the frequency signal defined as the reference. The timing for resetting the variable divider can be set accurately and easily by generating the rest signal, based on the set signal for the division ratio. Further, the phase of a signal obtained by frequency-dividing a feedback signal with respect to the frequency signal defined as the reference after the release of the resetting can uniquely be determined by generating the reset signal, based on the frequency signal defined as the reference.

It is desirable that during the resetting of the filter capacitors by the reset means, the phase comparator and the charge pump are deactivated or the transfer of the output of the phase comparator to the charge pump is blocked. Thus, the influence of the voltage applied to each filter capacitor due to the output of the charge pump can perfectly be eliminated. It is also possible to avoid the instability of the operation of each oscillator during the reset.

There is provided stop signal generating means which generates a stop signal changed to an effective level in synchronism with a change of a reset control signal to an effective level and changed to an ineffective level during a delay time greater than a pulse width of the frequency signal defined as the reference, rather than a change of the reset control signal to an ineffective level on the basis of the reset control signal generated by the reset signal generating means. The stop signal generating means may preferably be configured so as to control the resetting of each filter capacitor, and the deactivation of the phase comparator and charge pump or the cutting off of the transfer of the output of the phase comparator to the charge pump. Thus, it is possible to avoid that a signal defined as the reference and the edge of a feedback signal are phase-compared immediately after the phase comparator has been released from resetting, thereby preventing a malfunction.

BRIEF DESCRIPTION OF THE DRAWINGS

FIGS. 6(A) and 6(B) are respectively timing charts for describing operating waveforms in a locked state of a PLL circuit and at the changeover of a division ratio thereof.

DESCRIPTION OF THE PREFERRED EMBODIMENTS

Preferred embodiments of the present invention will hereinafter be described in detail with reference to the accompanying drawings.

Figure 1:
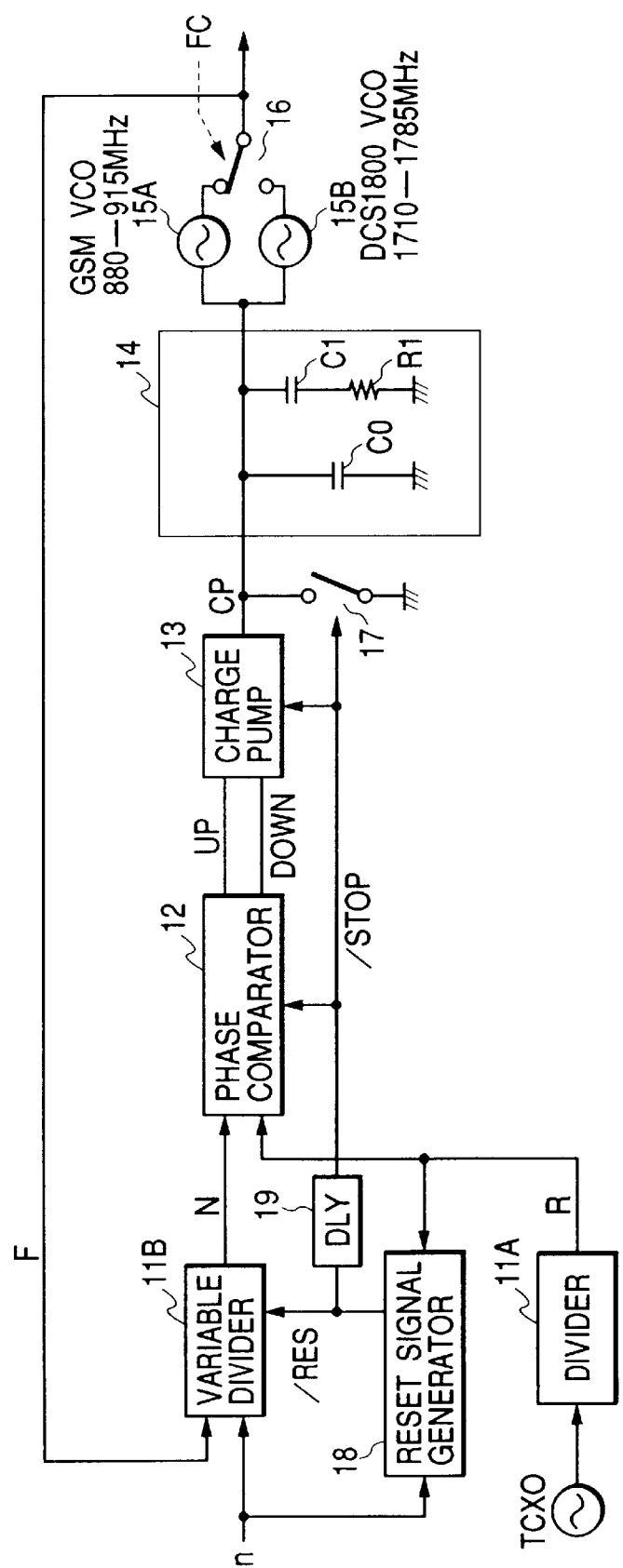
FIG. 1 is a block diagram showing a first embodiment of a PLL circuit according to the present invention.

FIG. 1 shows one embodiment in which the present invention is applied to a PLL circuit used as a local oscillator for generating an oscillation signal having a predetermined frequency, which merges with a receive signal and a transmit signal in cellular telephones such as GSM and DCS, which are capable of handling signals lying within two frequency bands.

As shown in FIG. 1, the PLL circuit 10 according to the present embodiment comprises a divider 11A which frequency-divides or divides a reference frequency signal TCXO like 13 MHz to produce a reference side pulse R of 200 KHz, for example, a variable divider 11B which divides a feedback signal F into a pulse N having a frequency of 200 KHz identical to the reference side pulse R, a phase comparator 12 which compares the phase of the divided feedback side pulse N and that of the reference side pulse R, a charge pump circuit or charge pump 13 which supplies or draws out an electrical charge corresponding to the detected phase difference, a secondary loop filter 14 which comprises capacitors C0 and C1 and a resistor R1 and generates a voltage corresponding to the electrical charge supplied from the charge pump, two voltage-controlled oscillators (VCO) 15A and 15B which respectively oscillate at a frequency corresponding to the voltage generated by the filter, and a selector switch 16 for selecting outputs oscillated from theses voltage-controlled oscillators 15A and 15B.

The voltage-controlled oscillator 15A is configured so as to be capable of oscillating at a frequency range widened by 5 to 10% upwards and downward from a frequency band which ranges from 800 MHz to 915 MHz of GSM, whereas the voltage-controlled oscillator 15B is configured so as to be capable of oscillating at a frequency range widened by 5 to 10% upwards and downwards from a frequency band which ranges from 1701 MHz to 1785 MHz of DCS.

The phase comparator 12 compares the phase of the feedback side pulse N frequency-divided by the variable divider 11B and that of the reference side pulse R frequency-divided by the divider 11A. When the phase of the feedback side pulse N lags, the phase comparator 12 outputs an up signal UP therefrom. When the phase of the feedback side pulse N leads, the phase comparator 12 outputs a down signal DOWN therefrom. The up signal UP and the down signal DOWN are supplied to the charge pump 13 for supplying and drawing out or discharging the electrical charge.

The charge pump 13 comprises a current source for the supply of a current and a current source for the drawing of a current. When the up signal UP is supplied to the charge pump 13, the charge pump 13 generates a positive current pulse CP and supplies it to the loop filter 14. When the down signal DOWN is supplied to the charge pump 13, the charge pump 13 generates a negative current pulse CP and supplies it to the loop filter 14. The loop filter 14 serves as a secondary low-pass filter. When the positive current pulse CP is supplied to the loop filter 14, the loop filter 14 serves so as to increase electrical charges stored in the capacitors C0 and C1. When the negative current pulse CP is supplied to the loop filter 14, the loop filter 14 serves so as to decrease the electrical charges stored in the capacitors C0 and C1. Thus, when the phase of the feedback pulse N lags, the voltage outputted from the loop filter 14 increases to thereby raise the oscillation frequency of the voltage-controlled oscillator 15A or 15B. When the phase of the feedback side pulse N leads, the voltage outputted from the loop filter 14 is lowered to reduce the oscillation frequency of the voltage-controlled oscillator 15A and 15B.

Incidentally, the loop filter 14 comprises a secondary filter. The time constant of the loop filter 14 is set in such a manner that a frequency response characteristic thereof, i.e., a loop band thereof reaches less than or equal to $\frac{1}{10}$ of the frequency (200 KHz in the present embodiment) of the signal compared by the phase comparator 12. This is because when the response characteristic is higher than that, the output voltage of the loop filter 14 varies up and down each time the output pulse is produced from the phase comparator 12, thereby destabilizing the oscillating operation of the voltage-controlled oscillator 15A or 15B corresponding to a next stage.

In the present embodiment, there are provided a switch 17 connected between an input node of the loop filter 14 and a constant voltage terminal like a ground potential GND and used for resetting the electrical charges of the filter capacitors C0 and C1, a reset signal generator 18 for generating a reset signal /RES for the variable divider 11B, based on the pulse R frequency-divided by the reference side divider 11A, and a delay circuit 19 for generating a stop signal /STOP which delays the rising edge of the generated reset signal /RES, based on the reset signal /RES.

The stop signal /STOP is supplied to the phase comparator 12 and the charge pump 13 to deactivate the operations of these circuits. Further, the stop signal /STOP is supplied to the reset switch 17 as a control signal so that the electrical charges stored in the filter capacitors C0 and C1 can be drawn out or discharged. Incidentally, the time tpd required to delay the rising edge of the stop signal /STOP generated from the delay circuit 19 may preferably be set to one longer than a pulse width of the reference side pulse R. Accordingly, the phase comparator 12 is prevented from phase-comparing the reference side pulse R having offered timing provided for the release of reset with the edge of the feedback side pulse N following the reference side pulse R.

The reset signal generator 18 detects a change in set signal n of a division ratio, which is supplied to the variable divider 11B from a system controller or the like and thereafter generates such a reset signal /RES as to fall in synchronism with the rising edge of a first or initial pulse of the output (reference side pulse R) of the reference side divider 11A and rise in synchronism with the rising edge of the next pulse. Described specifically, the reset signal generator 18 can comprise a detection circuit for detecting the change in division ratio set signal n, a circuit for generating an enable signal EN (see FIG. 2) brought to an effective level during one cycle of the reference side pulse R after its detection, a circuit for generating a reset signal varied in synchronism with the first or initial pulse of the reference side pulse R and the rising edge of a pulse subsequent thereto during an effective level period, etc. As a specific configuration for deactivating the phase comparator 12 and the charge pump 13 according to the stop signal /STOP, may be mentioned various methods such as the provision of a switch for cutting off or blocking a current supplied from the current source lying within the phase comparator 12 or charge pump 13, the provision of a logic gate for avoiding the transfer of the outputs UP and DOWN of the phase comparator 12 to the charge pump 13, etc.

The operation of the PLL circuit at the time that a changeover in the division ratio of the variable divider 11B and switching between the voltage-controlled oscillators 15A and 15B are performed, will next be explained with reference to a timing chart shown in FIG. 2. Incidentally, FIG. 2 shows a timing chart used to perform the changeover of a band from a GSM band ranging from 880 MHz to 915 MHz to a DCS band ranging from 1710 MHz to 1785 MHz.

Figure 2:
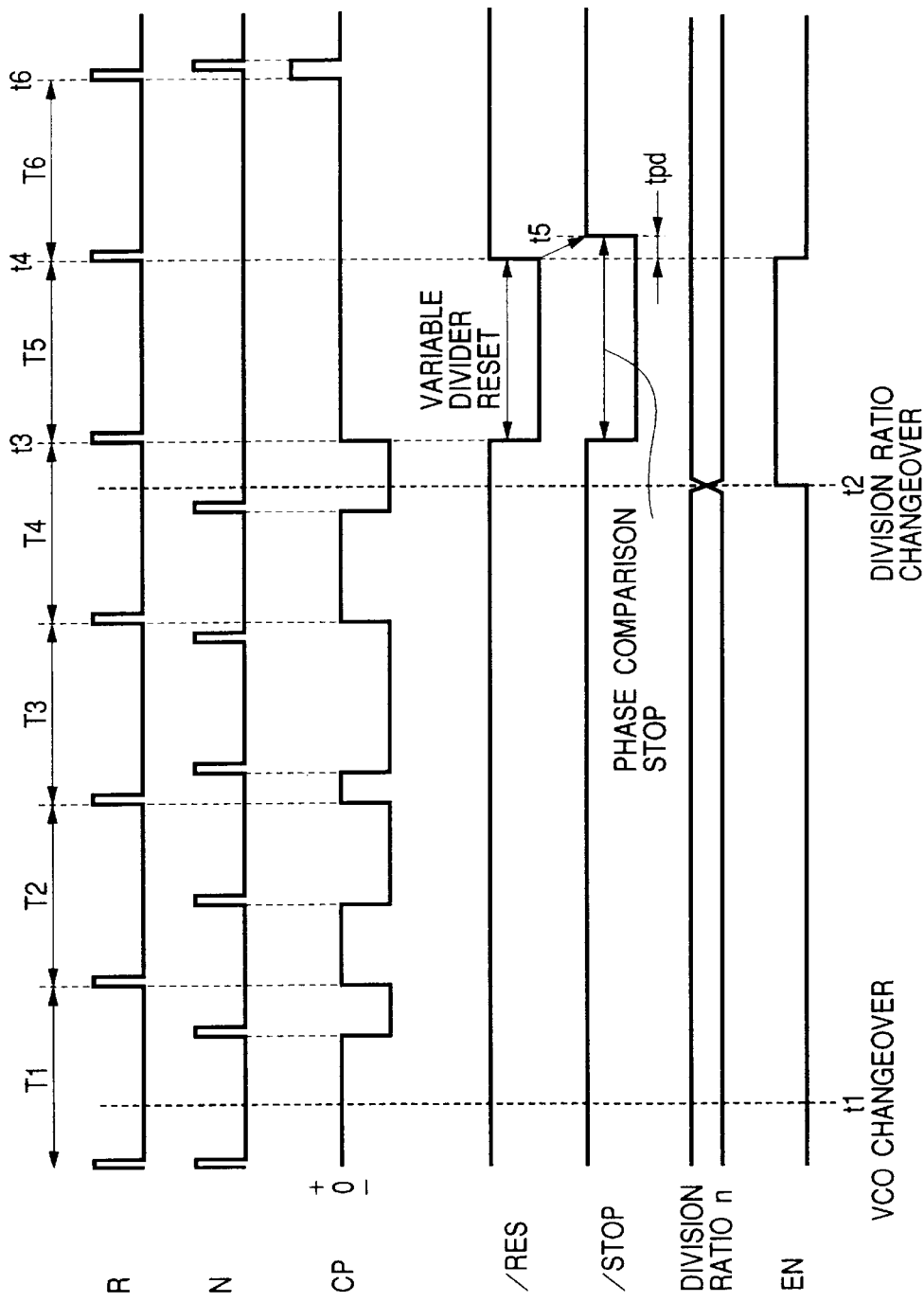
FIG. 2 is a timing chart for describing operating waveforms at the changeover of a division ratio and VCO, which are employed in the PLL circuit according to the first embodiment.

When the switching between the voltage-controlled oscillators is done with a timing t1 having a cycle T1 shown in FIG. 2, the cycle of an output (feedback side pulse N) of the variable divider 11B for frequency-dividing a feedback signal F becomes suddenly short. Therefore, a negative current pulse CP is outputted from the charge pump 13 and serves so as to lower the frequency of the corresponding voltage-controlled oscillator. Further, even if two pulses outputted from the other divider (variable divider B) are introduced during one cycle of the output of one divider (reference side divider 11A herein) as in the case of a cycle T3, the phase comparator 12 does not make a comparison with the two pulses. Therefore, the negative current pulse CP outputted from the charge pump 13 becomes considerably long. As a result, the output of the voltage-controlled oscillator on the selection side is transferred or transitioned to the lowest frequency of a frequency variable range.

When the division ratio of the variable divider 11B is changed over to another according to the division ratio set signal n supplied from the system controller or the like with a timing like t2 in this state, the reset signal generator 18 detects a change in the division ratio set signal n and thereafter generates such a reset signal /RES as to fall in synchronism with the rising edge (timing t3) of a first or initial pulse of a pulse R outputted from the reference side divider 11A and rise in synchronism with the rising edge (timing t4) of a pulse subsequent thereto. Thus, the variable divider 11B is kept in a reset state at all times during a period in which the reset signal /RES is low in level.

Further, a stop signal /STOP is changed into a low level in synchronism with the falling edge of the reset signal /RES. Thus, the reset switch 17 is turned on to draw or discharge electrical charges stored in the capacitors C0 and C1 of the loop filter 14 and fix a control voltage applied to the voltage-controlled oscillator 15B to a ground potential (0 V). Besides, the phase comparator 12 and the charge pump 13 are deactivated based on the stop signal /STOP. Therefore, the voltage-controlled oscillator 15B is controlled so as to oscillate at a lower limit frequency of a variable range.

Afterwards, the reset signal /RES is changed to a high level with the next rise timing t4 of the reference side pulse R so that the variable divider 11B is released from resetting. Thus, the variable divider 11B starts dividing anew from this point of time. Further, when the stop signal /STOP is changed to a high level with a timing t5 after a while, the phase comparator 12 and the charge pump 13 are released from their operation-stopped state and hence a phase comparison is started. However, the voltage-controlled oscillator 15B oscillates at the lower limit frequency of the variable range at this time. Further, since the reset signal /RES is formed based on the reference side pulse R, the rising edge thereof become delayed by a gate delay. Therefore, even if the oscillation frequency determined based on the division ratio n is a frequency close to the lower limit of the variable range, the cycle of the feedback side pulse N frequency-divided by the variable divider 11B becomes always longer than that of the reference side pulse R.

Therefore, the phase comparator 12 detects a lag in the phase of the feedback side pulse N with the next rise timing t6 of the reference side pulse R, and the charge pump 13 outputs a positive current pulse CP corresponding to a phase difference. Since, at this time, the voltage-controlled oscillator 15B oscillates at the lower limit frequency of the variable range, the PLL circuit starts from its closed state. Further, since the lag in the phase of the feedback side pulse N is merely a substantially difference in phase between a signal of 1710 MHz and a signal of 1785 MHz at the maximum, the voltage-controlled oscillator 15B completes a pull-in operation according to one positive current pulse CP outputted from the charge pump 13 and hence the PLL circuit is brought to a lockup state from the next cycle.

Contrary to the above, the relationship between the output (reference side pulse R) and N shown in FIG. 2 is reversed upon the changeover of the band from the DCS band ranging from 1710 MHz to 1785 MHz to the GSM band ranging from 880 MHz to 915 MHz. Further, the cycle of the output (feedback side pulse N) of the variable divider 11B for dividing the frequency of the feedback signal F becomes abruptly long. Therefore, a positive current pulse CP is outputted from the charge pump 13 and serves so as to increase the frequency of the corresponding voltage-controlled oscillator. Thus, the output of the voltage-controlled oscillator 15A is transitioned to an upper limit frequency of a variable range.

However, when the division ratio of the variable divider 11B is changed over to another according to the division ratio set signal n supplied from the system controller or the like with the timing like t2 even in this case, the reset signal generator 18 generates a low-active reset signal /RES (timing 3). Thus, the variable divider 11B is kept in a reset state at all times during a period in which the reset signal /RES is low in level, and the stop signal /STOP is changed to a low level. As a result, the reset switch 17 is turned on to draw out or discharge electrical charges stored in the capacitors C0 and C1 of the loop filter 14. Further, the phase comparator 12 and the charge pump 13 are deactivated according to the stop signal /STOP. Therefore, the voltage-controlled oscillator 15A is controlled so as to oscillate at a lower limit frequency of the variable range.

Thus, the reset signal /RES is changed to a high level with the next rise timing t4 of the reference side pulse R in a manner similar to the changeover of the band from the GSM band to the DCS band to thereby release the variable divider 11B from resetting, whereby the variable divider 11B starts dividing anew from this point of time. When the stop signal /STOP is changed to a high level with the timing t5, the phase comparator 12 and the charge pump 13 are released from the deactivated state, whereas the voltage-controlled oscillator 15A oscillates at the lower limit frequency of the variable range. Thus, the PLL circuit starts from a closed state. Further, since the reset signal /RES is formed based on the reference side pulse R, the rising edge thereof become delayed by a gate delay, the cycle of the feedback side pulse N frequency-divided by the variable divider 11B becomes always longer than that of the reference side pulse R.

Therefore, the phase comparator 12 detects a lag in the phase of the feedback side pulse N with the next rise timing t6 of the reference side pulse R, and the charge pump 13 outputs a positive current pulse CP corresponding to a phase difference. Since the lag in the phase of the feedback side pulse N at this time is relatively small, the voltage-controlled oscillator 15A completes a pull-in operation according to one positive current pulse CP outputted from the charge pump 13 and hence the PLL circuit is brought to a lockup state from the next cycle.

Figure 3:
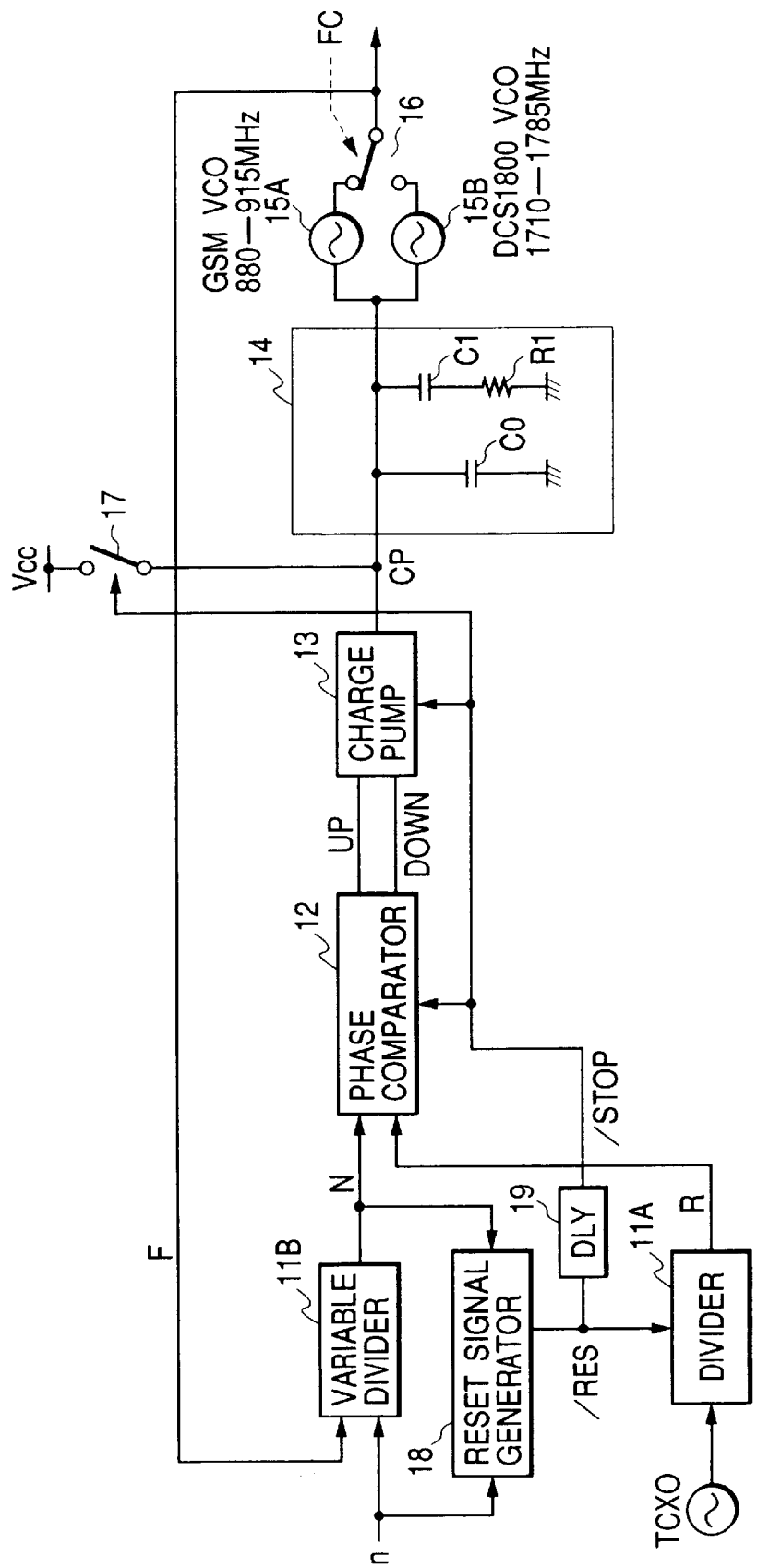
FIG. 3 is a block diagram illustrating a second embodiment of a PLL circuit according to the present invention.

FIG. 3 shows a second embodiment of a PLL circuit according to the present invention.

The present embodiment is one wherein in the embodiment shown in FIG. 1, the switch 17 for resetting the filter capacitors C0 and C1 connected between the input node of the loop filter 14 and the ground potential GND is connected between an input node of a loop filter 14 and a source voltage Vcc to thereby reset the filter capacitors to Vcc. When done in this way, a voltage-controlled oscillator 15A or 15B oscillates at an upper limit frequency of a variable range according to the reset even in the case of either the changeover of the band from the GSM band to the DCS band or the changeover of the band from the DCS band to the GSM band. Namely, the voltage-controlled oscillator 15A or 15B oscillates in a high state of oscillation frequency contrary to the first embodiment during a reset period.

Thus, a reset signal generator 18 for generating a reset signal /RES, based on the output (feedback side pulse N) of a variable divider 11B is provided in the present embodiment. The reset signal generator 18 resets a reference side divider 11A according to the reset signal /RES and causes a delay circuit 19 to produce a stop signal /STOP delayed from the falling edge of the reset signal /RES, thereby deactivating a phase comparator 12 and a charge pump 13.

Thus, since the reset signal /RES is formed based on the feedback side pulse N even if an oscillation frequency determined according to a division ratio n is a frequency close to an upper limit of a variable range of VCO, the rising edge thereof is delayed by a gate delay. Therefore, as an initial or first pulse after the release of reset, the output (feedback side pulse N) of the variable divider 11B inevitably results in timing earlier than the output (reference side pulse R) of the reference side divider 11A contrary to the first embodiment. Thus, the phase comparator 12 determines a feedback signal F to lead in phase and thereby outputs a down signal, and the charge pump 13 outputs a negative current pulse CP in response to it. Therefore, the voltage-controlled oscillator 15A or 15B is activated so as to lower its oscillation frequency. Further, since the voltage-controlled oscillator 15A or 15B oscillates at the upper limit frequency of the variable range during the reset period and hence the PLL circuit starts from its closed state, a frequency pull-in operation is completed according to one current pulse CP, whereby the PLL circuit can be brought to a lockup state.

Figure 4:
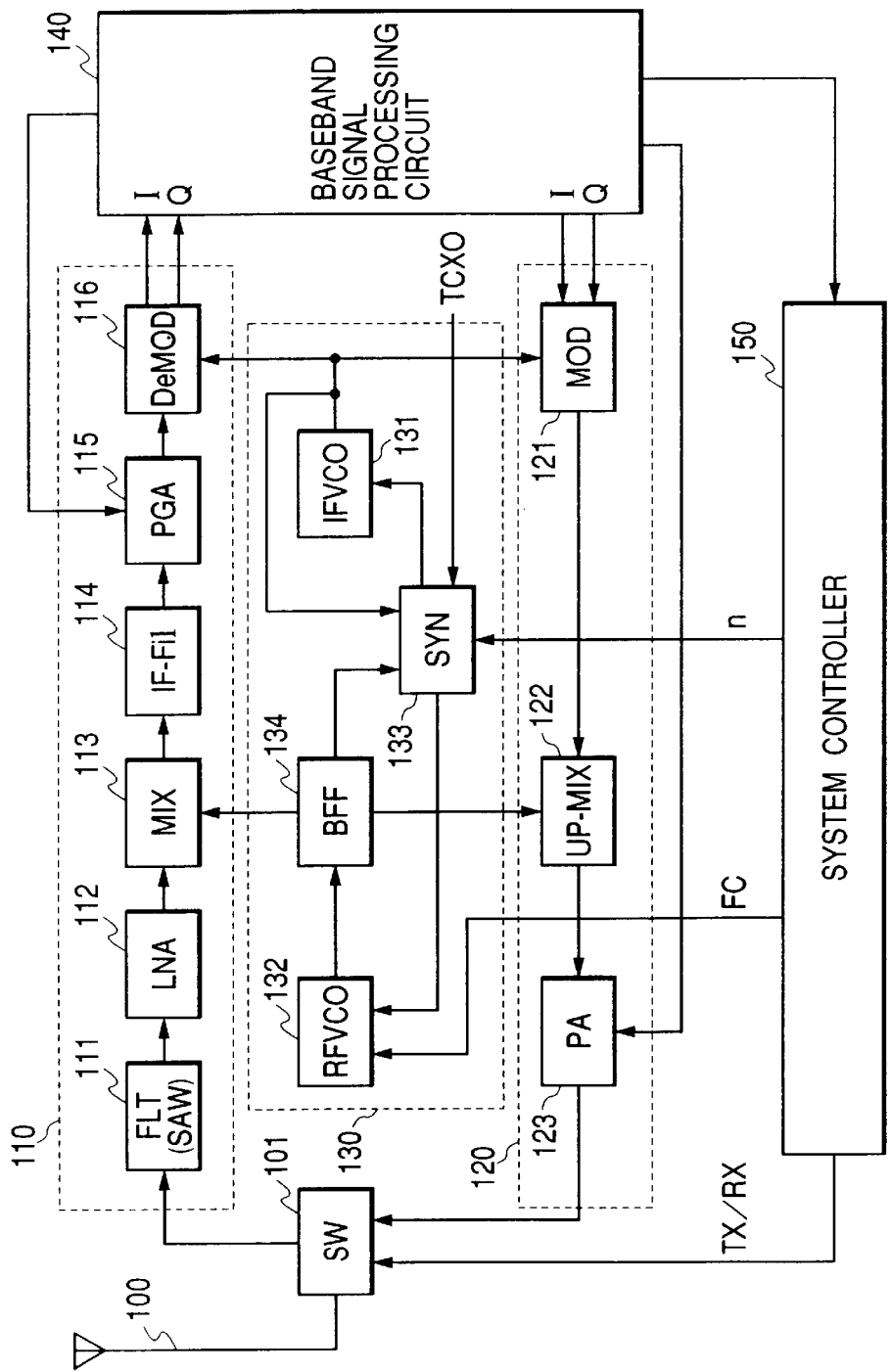
FIG. 4 is a block diagram showing an example of a configuration of a dual-band type cellular telephone system as a system example to which the PLL circuit according to the present invention is applied.

FIG. 4 shows an example of a configuration of a wireless communication system like a dual-band type cellular telephone using the PLL circuit according to the each of the embodiments referred to above. Although not restricted in particular, the system according to the present embodiment is one called a "so-called single superheterodyne system".

In FIG. 4, reference numeral 100 indicates an antenna for transmitting and receiving a signal radio wave, reference numeral 101 indicates a switch for performing switching between transmission and reception, reference numeral 110 indicates a reception system circuit for amplifying and demodulating a signal received by the antenna 100, reference numeral 120 indicates a transmission system circuit for modulating and frequency-converting a signal transmitted via the antenna 100, reference numeral 130 indicates an oscillation system circuit for generating local oscillation signals necessary for the reception system circuit 110 and the transmission system circuit 120, reference numeral 140 indicates a baseband signal processing circuit for extracting voice data from the received signal and converting the voice data to a voltage pulse train, and reference numeral 150 indicates a system controller comprising a microcomputer or the like for generally controlling the entire system, respectively. The PLL circuit according to the above embodiment is used in the oscillation system circuit 130.

The reception system circuit 110 comprises a bandwidth-limited filter (FLT) 111 comprised of a SAW filter for eliminating unnecessary waves from the signal received by the antenna 100, etc., a low noise amplifier circuit (LNA) 112 for amplifying a signal which has passed through the filter 111, a mixer (MIX) 113 for merging the amplified received signal with the local oscillation signal outputted from the oscillation system circuit 130 to thereby down-convert the result of merging to a signal having an intermediate frequency, a band-pass filter (BPF) 114 for allowing a signal having a frequency equivalent to the difference in frequency between the received signal and the local oscillation signal to pass therethrough, a gain-controllable programmable gain amplifier (PGA) 115 for amplifying the signal to a desired level, a demodulator (DeMOD) for demodulating the signal adjusted to the desired amplitude to a baseband signal (I/Q), etc.

The transmission system circuit 120 comprises a modulator (MOD) 121 for modulating a transmit signal inputted from the baseband signal processing circuit 140 as the baseband signal (I/Q) to a RF signal, a mixer (UP-MIX) 122 for combining the modulated signal and the oscillation signal outputted from the oscillation system circuit 130 together to thereby up-convert the result of combination to a signal having a desired transmit frequency, a power amplifier (PA) for power-amplifying the frequency-converted transmit signal and transmitting it through the antenna 100, etc.

The oscillation system circuit 130 comprises a voltage-controlled oscillator (RFVCO) 132 for a RF signal, a voltage-controlled oscillator (IFVCO) 131 for generating an intermediate frequency signal (whose frequency is constant) necessary for the demodulator 116 and the modulator 121, a synthesizer (SYN) 133 for comparing the difference in phase between each of feedback signals from these VCO 131 and 132 and a reference signal TCXO supplied from an oscillation circuit which uses a crystal resonator and is high in frequency accuracy and less reduced in temperature dependence and generating control voltages corresponding to the respective VCO, a buffer (BFF) 134 for distributing and supplying the oscillation signals generated by the RFVCO 132 to the mixer 113 on the receiving side and the mixer 122 on the transmitting side, etc.

Here, the voltage-controlled oscillators 15A and 15B and the selector switch 16 shown in FIG. 1 and FIG. 3 correspond to the VCO 131 and 132 shown in FIG. 4. The RFVCO 132 and IFVCO 131 are respectively provided with the two voltage-controlled oscillators 15A and 15B. Further, the dividers 11A and 11B, phase comparator 12, charge pump 13 and loop filter 14 shown in FIGS. 1 and 3 are shown as the synthesizer (SYN) 133 in FIG. 4. The reset switch 17, reset signal generator 18 and delay circuit 19 are provided within the synthesizer 133.

In the system according to the present embodiment, the system controller 150 changes a division ratio set signal n supplied to the variable divider lying inside the synthesizer 133 and changes a VCO switch control signal FC for each of the RFVCO 132 and IFVCO 131 upon a change in channel. Further, when it is desired to perform switching between transmission and reception, the system controller 150 performs such control as to change a transmit/receive changeover control signal TX/RX for the selector switch 101.

The invention made by the present inventors as described above has been described specifically by the embodiments. However, the present invention is not limited to them. While, for example, each of the embodiments has been described as the PLL circuit provided with the two voltage-controlled oscillators 15A and 15B at the stage subsequent to the charge pump 13, the number of the voltage-controlled oscillators is not limited to two as in the case of the embodiments. The present invention is applicable even to a case in which the number thereof is three or more. Even in this case, advantageous effects similar to the embodiments can be obtained.

Figure 5:
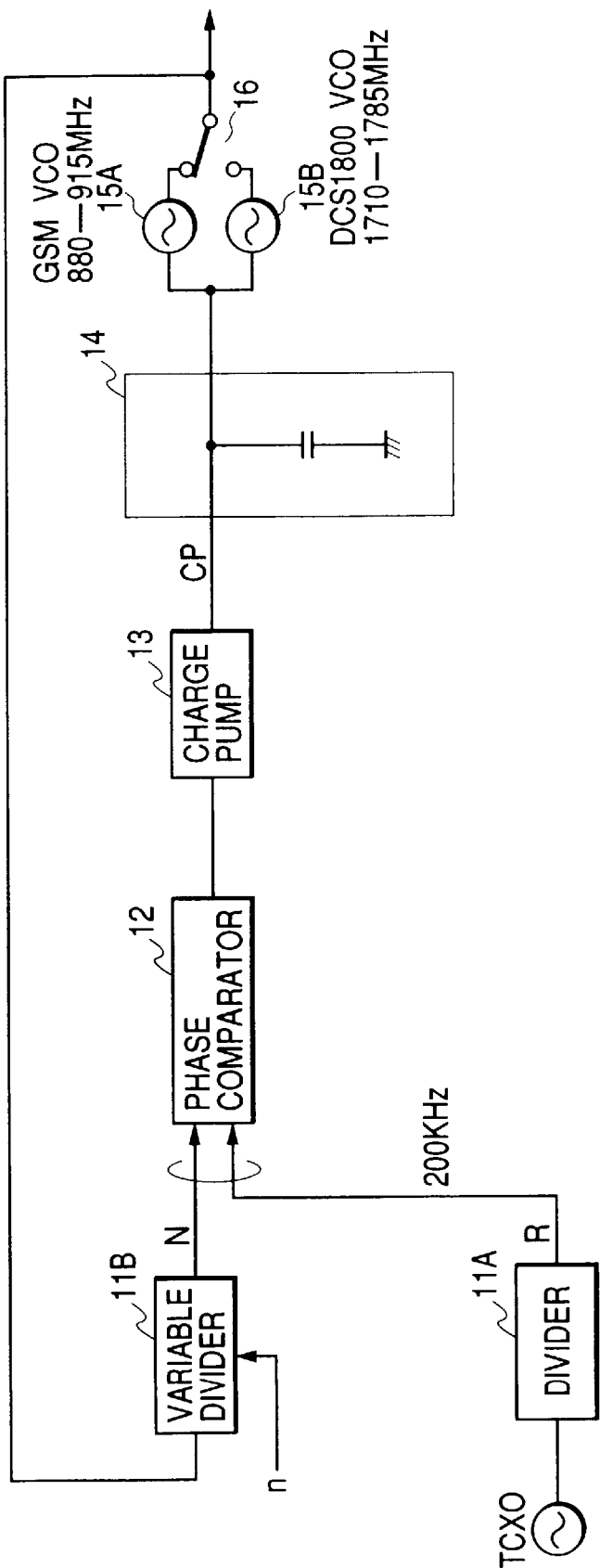
FIG. 5 is a block diagram depicting an example of a configuration of a conventional PLL circuit.
Figure 7:
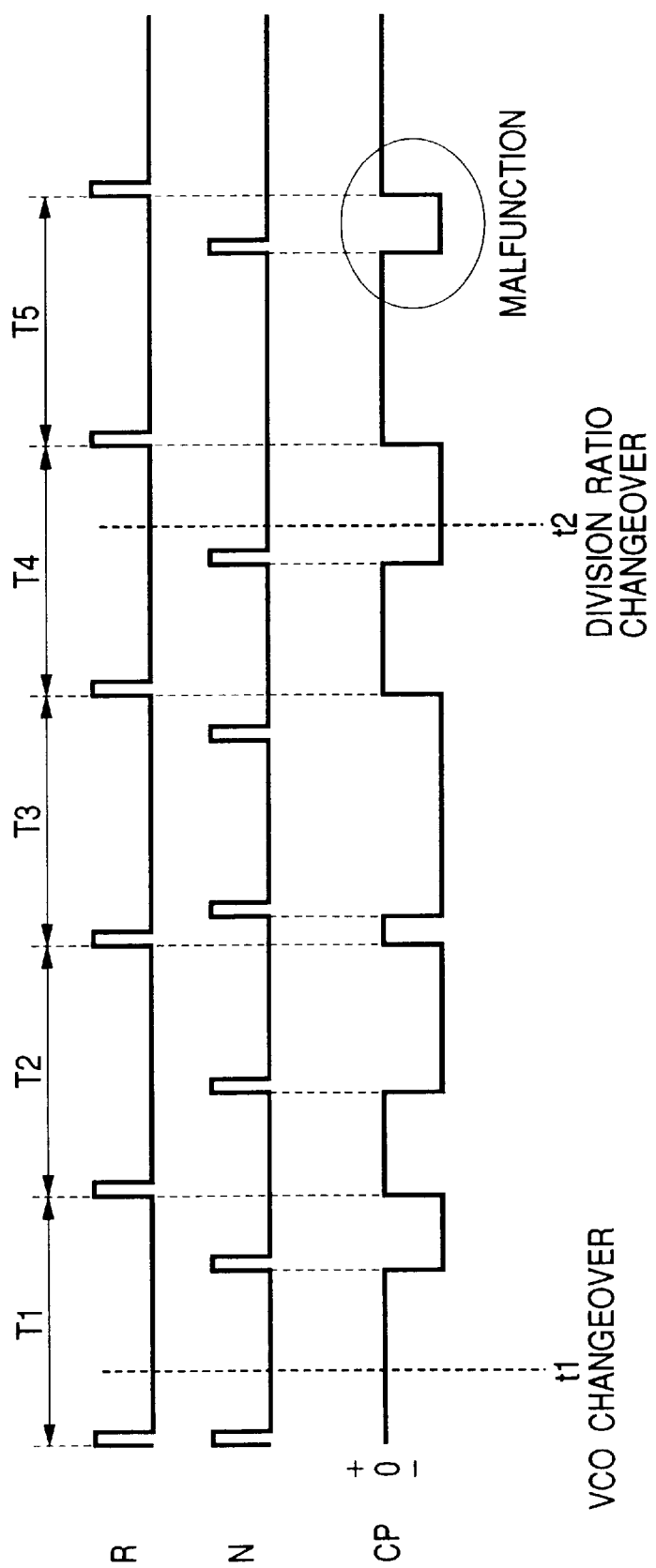
FIG. 7 is a timing chart for describing operating waveforms at the changeover of a division ratio and VCO, which are employed in a PLL circuit.

Further, the terminal to which the reset switch 17 is connected, is not limited to the ground point GND and the source voltage terminal Vcc. The terminal can be configured as an arbitrary fixed-potential terminal. The loop filter 14 is not limited to the secondary filters each comprised of the capacitors C0 and C1 and the resistor R1 as shown in FIGS. 1 and 3. The loop filter 14 may be a primary filter comprised of such a capacitor as shown in FIG. 5. While the divider 11A for dividing the frequency of the reference signal is provided in each embodiment, the divider is not always required and may be omitted depending on the frequency of the reference signal.

Further, the application referred to above has described the wireless communication system like the cellular telephone called "the single superheterodyne system". It is however needless to say that the present invention can be applied even to a wireless communication system like a portable or cellular telephone called a double superheterodyne system wherein a second mixer for further down-converting a down-converted signal is provided behind the mixer 113 on the receiving side in the single superheterodyne system, and a wireless communication system like a cellular telephone called a direct convert system wherein the mixer on the receiving side is omitted and a received signal which has been amplified and has passed through a predetermined band-pass filter, is directly inputted to a demodulator.

The above description has been made of the case in which the invention made by the present inventors is principally applied to the PLL circuit employed in the wireless communication system like the cellular telephone, which belongs to the field of application taken as the background of the invention. However, the present invention is by no means limited to it. The present invention can generally and widely be applied to a PLL circuit which is provided with two or more VCO and allows them to operate according to a changeover in frequency, and a system having the PLL circuit.

An advantageous effect obtained by a typical one of the inventions disclosed in the present application will be described in brief as follows:

According to the present invention, a wireless communication system provided with a PLL circuit having a plurality of VCO can bring about an advantageous effect in that a frequency pull-in time at a changeover in VCO can be shortened and a frequency pull-in operation can always be completed within a predetermined time upon the changeover in VCO.

What is claimed is:
1. A wireless communication system comprising:
a reception system circuit which processes a signal received by an antenna;
an oscillation system circuit including a PLL circuit which generates local oscillation signals each merged with the signal processed by said reception system circuit, said PLL circuit having a phase comparator which detects the difference in phase between a frequency signal defined as the reference and a feedback signal, a charge pump which generates a voltage in response to the phase difference detected by said phase comparator, filter capacitors, and a plurality of oscillators which oscillate based on voltages of the filter capacitors;
control means which controls said reception system circuit and said oscillation system circuit; and
setting means which sets the voltage applied to said each filter capacitor to a predetermined voltage, based on a signal outputted from said control means, when switching is made between said oscillators.
2. The wireless communication system according to claim 1, wherein said PLL circuit includes a variable divider which divides the frequency of said feedback signal sent from any of said oscillators, which is phase-compared with the frequency signal defined as the reference by said phase comparator, and a division ratio of said variable divider is changed based on the signal outputted from said control means to thereby select the frequency of the received signal.

3. The wireless communication system according to claim 2, wherein said voltage setting to said each filter capacitor by said setting means is equivalent to a setting to a ground potential.

4. The wireless communication system according to claim 3, wherein the change in the division ratio of said variable divider is carried out after the switching between said oscillators has been performed, said variable divider is set to an initial state after said change in division ratio, and said setting to said each filter capacitor by said setting means is carried out in interlock with the setting of said variable divider.

5. The wireless communication system according to claim 4, wherein the change in the division ratio of said variable divider is carried out after the switching between said oscillators has been performed, the setting of said variable divider and said each filter capacitor is started after the change in the division ratio of said variable divider, and the voltage setting to said each filter capacitor is released after the setting of said variable divider to the initial state has been released.

6. The wireless communication system according to claim 5, further including set signal generating means which generates a control signal for setting said variable divider to the initial state, and wherein said set signal generating means generates a set signal brought to an effective level during a period between a first pulse of the frequency signal defined as the reference and a pulse subsequent to the first pulse after the change in the division ratio, based on a signal for setting the division ratio of said variable divider and the frequency signal defined as the reference.

7. The wireless communication system according to claim 6, further including stop signal generating means which generates a stop signal changed to an effective level in synchronism with a change of the set signal to the effective level and changed to an ineffective level during a delay time greater than a pulse width of the frequency signal defined as the reference, rather than a change of the set signal to an ineffective level on the basis of the set signal generated by said set signal generating means, and wherein said stop signal generating means controls the setting of the voltage of said each filter capacitor to the predetermined voltage, and the deactivation of said phase comparator and charge pump or the cutting off of the transfer of the output of said phase comparator to said charge pump.

8. The wireless communication system according to claim 7, further including a transmission system circuit which processes a signal transmitted through said antenna.

9. The wireless communication system according to claim 5, wherein when the voltage applied to said each filter capacitor is set to a predetermined voltage, said phase comparator and said charge pump are deactivated or the transfer of the output of said phase comparator to said charge pump is blocked.

10. The wireless communication system according to claim 1, further including a transmission system circuit which processes a signal transmitted from the antenna, and wherein said PLL circuit generates a local oscillation signal merged with the signal processed by said transmission system circuit, and said transmission system circuit processes two or more transmit signals different in frequency band from one another according to the switching between the plurality of oscillators of said PLL circuit.

11. The wireless communication system according to claim 10, wherein the division ratio of said variable divider is changed to select the frequency of a transmit signal.

* * * * *